US005939924A

United States Patent [19]

Visocchi et al.

[11] Patent Number: 5,939,924

[45] Date of Patent: Aug. 17, 1999

[54] INTEGRATING CIRCUIT HAVING HIGH TIME CONSTANT, LOW BANDWIDTH FEEDBACK LOOP ARRANGEMENTS

[75] Inventors: Pasqualino Michele Visocchi, Middlesex; Richard Butson, Essex, both of United Kingdom

[73] Assignee: Northern Telecom Limited, Montreal, Canada

[21] Appl. No.: 08/729,099

[22] Filed: Oct. 11, 1996

[30] Foreign Application Priority Data

Oct. 13, 1995 [GB] United Kingdom .................. 9521031

[51] Int. Cl.[6] ...................................................... H03K 4/08

[52] U.S. Cl. .......................... 327/336; 327/345; 327/552; 327/156

[58] Field of Search .................................... 327/336, 341, 327/344, 345, 362, 363, 590, 552, 558, 156, 147; 331/17

[56] References Cited

U.S. PATENT DOCUMENTS 4,064,406 12/1977 Tiemeijer ................................ 327/336
5,376,892 12/1994 Gata ........................................ 327/336

FOREIGN PATENT DOCUMENTS 139466 1/1980 Netherlands ........................... 327/345

OTHER PUBLICATIONS

Huelsman, "Basic Circuit Theory", 3rd edition, pp. 596–599, 1972.

*Primary Examiner*—Timothy P. Callahan
*Assistant Examiner*—Eunja Shin
*Attorney, Agent, or Firm*—Lee, Mann, Smith, McWilliams, Sweeney & Ohlson

[57] ABSTRACT

This invention relates to an integrating circuit and finds application in high time constant low bandwidth feedback loop arrangements, e.g. in phase locked loop circuits. A well-known form of integrator is the Miller integrator, as used in Phase Lock Loop circuits (PLL) which are frequently used in communication systems, and are employed, for example, in clock extraction circuits in optical fiber receivers. With the advent of Passive Optical Networks (PON) becoming a means of providing fiber to the home very accurate timing information is required, to allow the outstation optical transmitter to send data within its designated time slot. The timing source at the base station needs to have a narrow jitter bandwidth of no more than, typically, 0.1 Hz, which cannot be realized with known phase lock loop circuits. The present invention seeks to provide an improved integrator which allows the fabrication of such timing circuits using standard components.

11 Claims, 5 Drawing Sheets where Cf = 3μF
Rs = 1KΩ
Rf = 100KΩ
Rz = 7.2MΩ
R1 = 48.5KΩ
R2 = 1KΩ
R3 = 1MΩ where Cf = 1μF
Rs = 1KΩ
Rf = 100KΩ
Cz = 150nF
R1 = 120 KΩ
R2 = 820 Ω
R3 = 1MΩ
R4 = 10KΩ

Fast Lock : Q1 on
Q2 off
$$\frac{Uo}{Ui} = \frac{-100(1+s\,57\times10^{-3})}{(1+s168\times10^{-3})}$$

Slow Lock : Q1 off
Q2 on
$$\frac{Uo}{Ui} = \frac{-100(1+s21.55)}{(1+s14.99\times10^{3})}$$

INTEGRATING CIRCUIT HAVING HIGH TIME CONSTANT, LOW BANDWIDTH FEEDBACK LOOP ARRANGEMENTS

FIELD OF THE INVENTION

This invention relates to an integrating circuit and finds application in high time constant low bandwidth feedback loop arrangements, such as temperature control circuits and in phase locked loop circuits.

BACKGROUND TO THE INVENTION

A well-known form of integrator is the Miller integrator. The Miller integrator incorporates an active device, e.g. a transistor amplifier, in order to improve the linearity of the output from a source such as a pulse generator. A capacitance connected between the input and the output of the amplifier results in an apparent increase in the capacitance across the input terminals of the amplifier. With current technology the amplifier is conveniently configured as an operational amplifier.

A Phase Lock Loop (PLL) is a frequently used circuit in communication systems, and is employed, for example, in radio tuning circuits and clock extraction circuits in optical fibre receivers for timing references.

The basic structure of a PLL is shown in FIG. 1. The main components consist of a phase detector 10, a loop filter 12, a voltage controlled oscillator 14 and a feed back loop 16 which typically incorporates a divider 18. The PLL compares an incoming signal, such as a clock signal, with its feedback clock.

The difference between these two signals generates an error signal proportional to the gain of the phase detector, Kd, which error signal is applied to the loop filter. The loop filter typically consists of an active single pole-zero filter such as a typical Miller integrator with a compensating zero, providing both high dc gain, which reduces input phase error (usually the gain of the filter, G is not less than 40 dB) and low frequency bandwidth. The output of this active filter adjusts a Voltage Controlled Oscillator (VCO) or a crystal VCO (VCXO) to lock the output signal to the input signal. The VCO however may have a centre frequency ($f_o$) at a much higher frequency (depending on system requirements) and a therefore a divide down counter may be placed within the feedback path, which completes the loop.

As with all second order feedback circuits (not just PLL) the PLL has two distinct characteristics The Natural Frequency, $\omega_n=2\pi f_n=(K_oK_dG/t_1N)^{1/2}$; and the Damping Factor, $\zeta=(\frac{1}{2}\omega t_1)+(\omega_n t_2/2)$ These two parameters are determined by, inter alia, the characteristics of the loop filter.

The 3 dB bandwidth of the PLL is known as the Jitter Bandwidth ($f_{jb}$) which is defined as:

$$f_{jb}=f_n\left(2\varsigma^2+1+\sqrt{((2\varsigma^2+1)^2+1)}\right)^{1/2}$$

To prevent a jitter gain of greater than 0.5 dB; the damping factor, $\zeta$, needs to be greater than or equal to 1.76.

With the advent of Passive Optical Networks (PON) becoming a means of providing fibre to the home with the ability to allow householders to become interactive (i.e. providing facilities such as video on demand, home shopping etc.) the optical transmitter at the home (outstation) requires very accurate timing information. This timing information can be derived from the down stream source (the broadcast base station transmitter). This timing information is provided to allow the outstation optical transmitter to send data within its designated time slot. The timing source at the base station is provided by a primary PLL which needs to have a jitter bandwidth of no more than, typically, 0.1 Hz, for 50 Mb/s transmission. This jitter bandwidth requires that the natural frequency of the PLL must be in the order of 0.025 Hz.

If a standard Miller integrator of the type shown in FIG. 2 were used to provide a jitter bandwidth of 0.025 Hz while maintaining a damping factor equal to 1.76, then;

i) the first (pole) time constant, $t_1$, would need to be $14.99\times10^3$ sec; and ii) the second (zero) time constant, $t_2$, would need to be 21.55 sec $$\text{where: gain, } G=100;\quad K0=64.32\times10^3$$

$$Kd=0.796\quad N=12.8\times10^3$$

Since $t_1$=Cf Rf $t_2$=Cf Rz and

G=−Rf/Rs

Thus, if a standard Miller integrator were to be employed to provide such a stringent PLL jitter bandwidth, the values of the resistors that would be required would be of the order of tens of GΩ. Resistors of this rating are, however, not be realisable when used with standard sizes of low leakage, non-electrolytic capacitors.

An alternative type of Miller integrator is known from GB2220092B, and an example of such is shown in FIG. 3. This type of circuit has the potential to provide enhanced time constants: whilst this integrator effectively multiplies the value of the integrating resistor by the gain G, the value of R is still required to be of the order of MΩ which is unrealisable in some practical circuits.

OBJECT OF THE INVENTION

The present invention seeks to provide an improved form of integrating network wherein the values of the components employed in the circuit can be both easily and economically obtained.

SUMMARY OF THE INVENTION

In accordance one aspect of the present invention, there is provided an integrating circuit including first and second operational amplifiers, the output of the first amplifier being coupled via an attenuation network to an inverting input of the second amplifier and to ground, the first amplifier having a feedback connection between its output and its inverting input, the second amplifier being configured as a Miller integrator, with the feedback acting on the inverting input of the second amplifier, the output of the second amplifier being coupled to the non-inverting input of the first amplifier by a part of the feedback loop, the signal input(s) to the integrating circuit being at the non-inverting inputs of the amplifiers.

In accordance with one embodiment, the output of the first amplifier is coupled via first and third resistors to an inverting input of the second amplifier and via first and second resistors to ground. The non-inverting input of one amplifier can be connected to ground. A plurality of signal input terminals can be connected to the non-inverting input of the first amplifier via respective input resistances.

A plurality of signal input terminals can be connected to the non-inverting input of one amplifier via respective input resistances.

The feedback circuit of the Miller integrator arrangement can further comprise a resistor.

In accordance with another aspect of the present invention, there is provided an integrating circuit including first and second operational amplifiers, the output of the first amplifier being coupled via an attenuating network to an inverting input of the second amplifier and to ground, the first amplifier having a feedback connection between its output and its inverting input, the second amplifier being configured as a Miller integrator, with the feedback acting on the inverting input of the second amplifier, the output of the second amplifier being connected to the non-inverting input of the first amplifier, the signal inputs to the integrating circuit being at the non-inverting inputs of the amplifiers, wherein the output of the first amplifier is coupled via an intermediate resistor and first and third resistors to an inverting input of the second amplifier and the inverting input of the second amplifier is coupled via first and second resistors to ground; and wherein the feedback loop of the Miller integrator comprises a first capacitor which is connected to both the non-inverting input of the second amplifier and a further capacitor, the further capacitor being connected at its second terminal between the intermediate resistor and the first resistor.

Preferably, the feedback loop for the inverting input of the first amplifier comprises a resistor, and wherein the feedback loop of the first amplifier and the grounding resistor are connected to ground via respective switching circuits operable to reduce the integrating time constants.

More preferably, the feedback loop for the inverting input of the first amplifier comprises a resistor, and wherein the feedback loop of the first amplifier and the grounding resistor are connected to ground via respective switching circuits operable to reduce the integrating time constants, and wherein the switching circuits comprise FET switching circuits.

In accordance with a further aspect of the invention, there is provided a method of operating an integrating circuit including first and second operational amplifiers, wherein the output of the first amplifier is coupled via an attenuating network to an inverting input of the second amplifier and to ground, the first amplifier having a feedback connection between its output and its inverting input, the second amplifier being configured as a Miller integrator, with the feedback acting on the inverting input of the second amplifier, the output of the second amplifier being connected to the non-inverting input of the first amplifier, the signal inputs to the integrating circuit being at the non-inverting inputs of the amplifiers; the method comprising the steps of inputting signals at the signal input ports to the integrating circuit and feeding a signal to the first amplifier and its non-inverting input, feeding back a signal between the output of the first amplifier and its inverting input, coupling the output of the first amplifier via an attenuating network to an inverting input of the second amplifier and to ground, feeding back a signal from the output of the second amplifier and its inverting input, whereby a modulated output is produced dependent upon the relative phase of the input signals.

An integrating circuit in accordance with the present invention can be designed to provide the required time constants $t_1$ & $t_2$ needed for the primary phase locked loop for passive optical networks using practical component values.

BRIEF DESCRIPTION OF THE DRAWINGS

Embodiments of the invention will now be described with reference to the accompanying drawings, wherein.

DETAILED DESCRIPTION OF PREFERRED EMBODIMENTS

Figure 4:
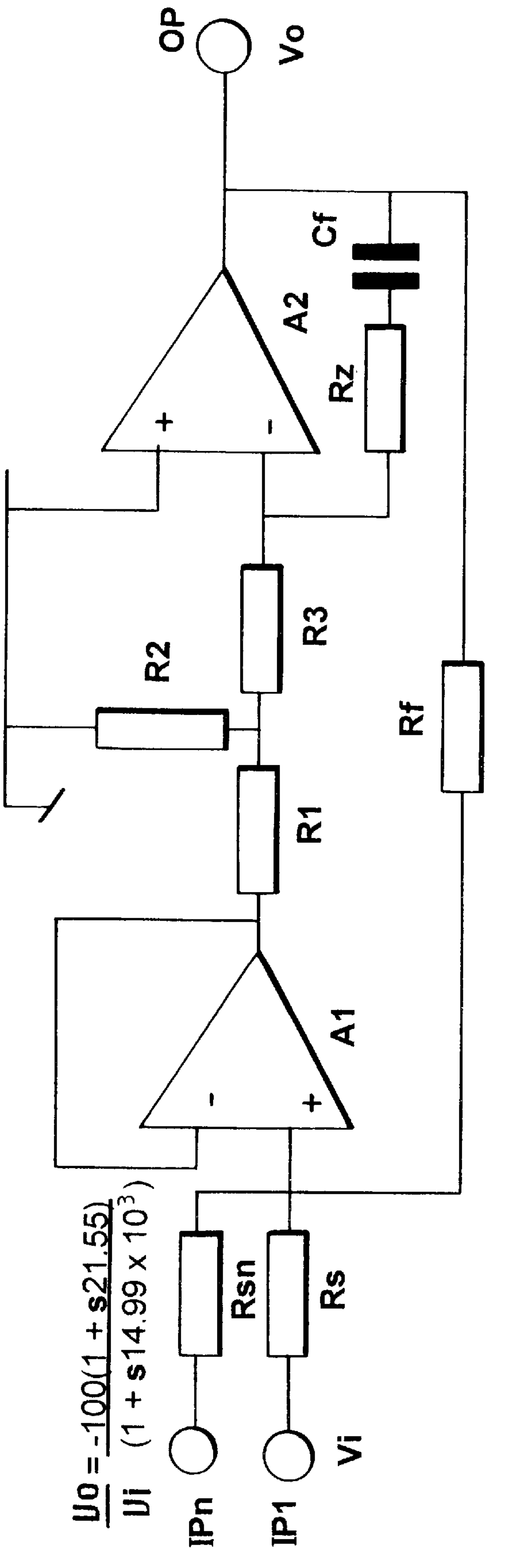
FIG. 4 is a first integrator made in accordance with the invention.

Referring now to FIG. 4, there is shown one embodiment of the present invention. The circuit comprises first and second operational amplifiers $A_1$, $A_2$, with signal input terminals at $IP_1$ to $IP_n$ and an output at OP. A plurality of signal input terminals can be connected to the non-inverting input of one amplifier via respective input resistances Rs to Rsn. For convenience, the remainder of the description will refer to only one input resistor Rs. The output of the first amplifier $A_1$ is connected via first and second resistors R1, R2 to ground and via first and third resistors R1, R3 to an inverting input of the second amplifier. The first amplifier has a feedback connection between its output and its inverting input; the second amplifier is configured as a Miller integrator. The Miller arrangement comprising a feedback acting on the inverting input of the second amplifier. The feedback is shown as comprising a capacitor Cf and resistor Rz in series, but the resistor need not be present for certain designs. The output of the second amplifier is connected via a fourth resistor Rf to the non-inverting input of the first amplifier.

The timing constant, $t_1$, can be calculated as follows:

$$t_1=Cf(R((1+Rf/Rs)/A)+Rz)$$

Since $$t_2=Cf.Rz$$

$$A=R2/(R1+R2)$$

$$R=R3+(R1.R2/(R1+R2))$$

$$G=-Rf/Rs$$

It can be shown that the values of components can be:

Cf=3 μF

Rs=1 KΩ

Rf=100 KΩ

Rz=7.2 KΩ

R1=48.5 KΩ

R2=1 KΩ

R3=1 MΩ

The effect of placing an attenuation network formed by R1 & R2 within the feedback path of the two op-amps, multiplies the effect of the source resistance which is modelled by R. If the parallel combination of R1 & R2 are small in comparison to R3, then R~R3. The effect on R is multiplied by (1+G) but with the addition of only two resistors which provide an attenuated signal, the multiplication is thus enhanced to (1+G)/A.

Figure 1:
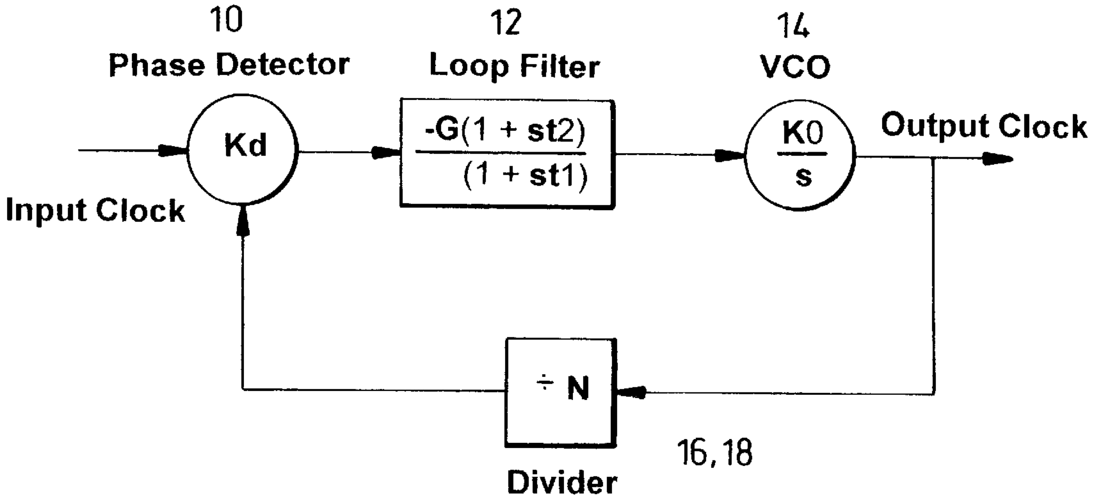
Fig. 1 (Prior Art)
FIG. 1 depicts a basic phase lock loop layout.
Figure 2:
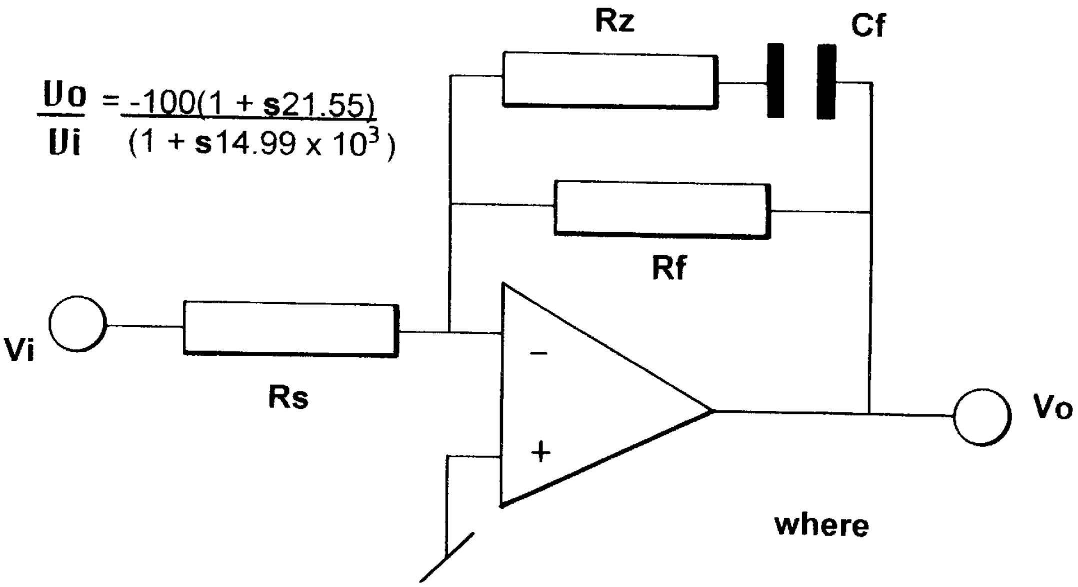
Fig. 2 (Prior Art)
FIG. 2 is a standard Miller integrator with a compensating zero.
Figure 3:
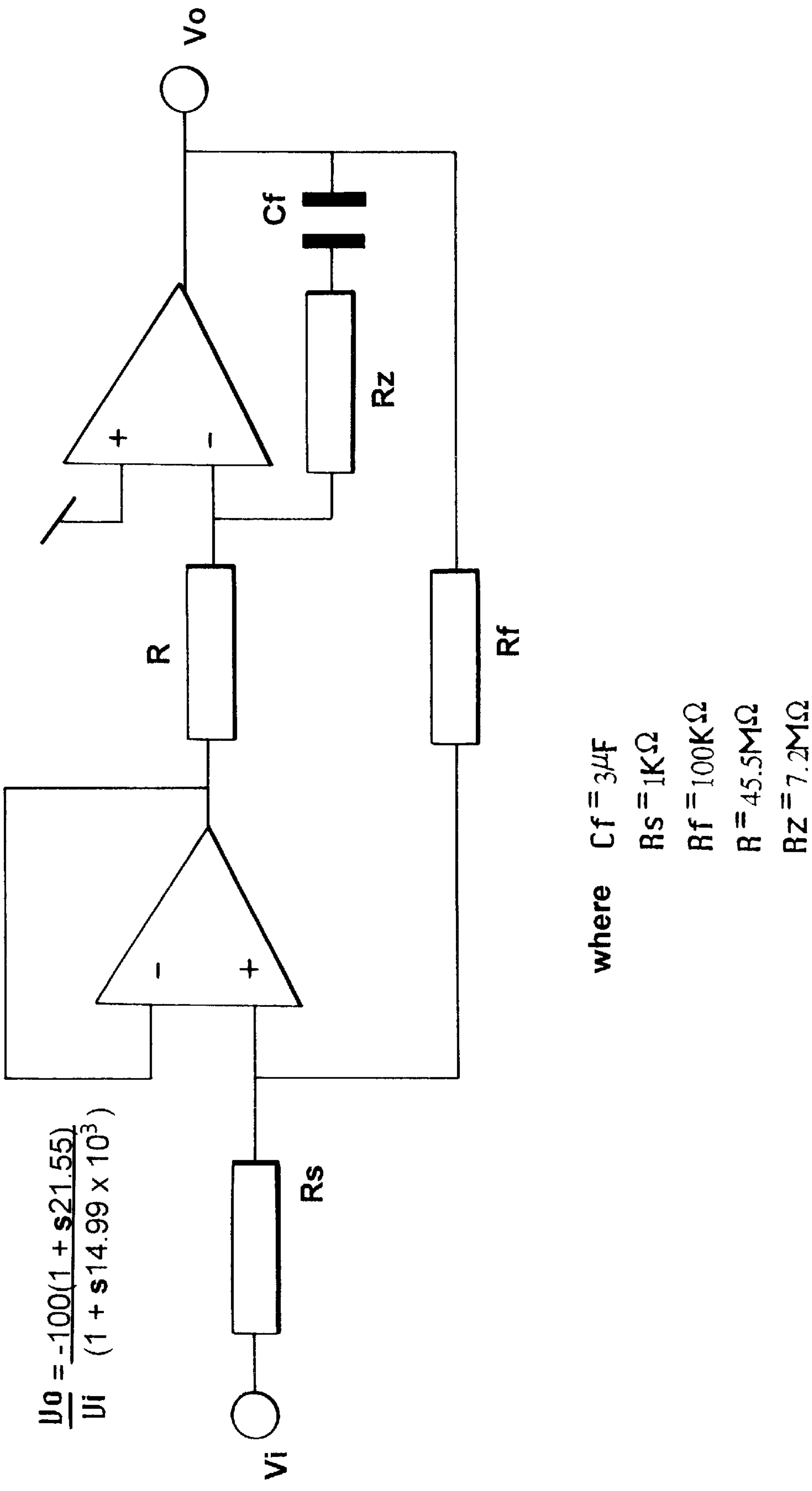
Fig. 3 (Prior Art)
FIG. 3 is a known Miller integrating circuit.

This effect is also beneficial if an application calls for a low value of gain G but a high time constant $t_1$. If for example the circuit shown in FIG. 3 were used to provide an integrating function with unity gain and no zero (i.e. Rz=0), then $t_1$=2 C R which provides little advantage over the standard Miller integrator. However, in the embodiment shown, the time constant, $t_1$=2 C R/A, and A could be small to make the time constant large.

Figure 5:
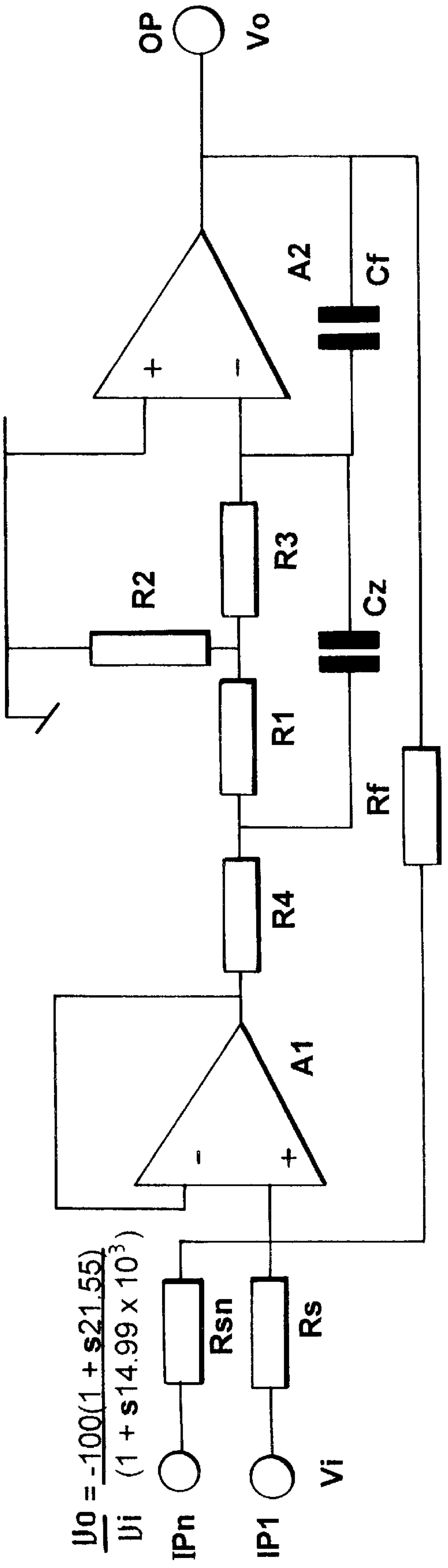
FIG. 5 is a second integrator made in accordance with the invention.

Whilst the value of the capacitance Cf has been reduced to a more manageable 3 μF, the compensating resistor, Rz (zero compensation) is required to be 7.2 MΩ. Such large resistances can be implemented fairly easily using a number of smaller value resistors, but take up expensive board space. Obviously, all surface mounted components take up board space, which is usually at a premium, and a small number of surface mount components is preferred. To overcome this requirement, it would be possible to place an additional capacitance parallel with resistances R1 and R3 and placing an additional resistance, R4 between the first amplifier and the resistance R1. This utilises the effective large resistance formed by the T network of resistances R1, R2 and R3. This is illustrated in FIG. 5.

It can be shown that the values of components can be:

Cf=1 μF

Cz=150 nF

Rs=1 KΩ

Rf=100 KΩ

R1=120 KΩ

R2=820 KΩ

R3=1 MΩ

R4=10 KΩ

Since $$t_1=Cf(R((1+Rf/Rs)/A)+Rz)$$

$$t_2=Cz.Rz$$

$$A=R2/(R1+R2)$$

$$R=R3+(R1.R2/(R1+R2))$$

$$Rz=R1+R3(1+R1/R2);\ \text{assuming } R4<<R1$$

$$G=-Rf/Rs$$

As shown by FIG. 5 and the above equations, the introduction of a compensation capacitance in parallel with the T network, produces a large time constant of 22 s using a small capacitance of 150 nF. An additional resistor R4 is required to provide a resistive load for stability of the unity gain operational amplifier.

Figure 6:
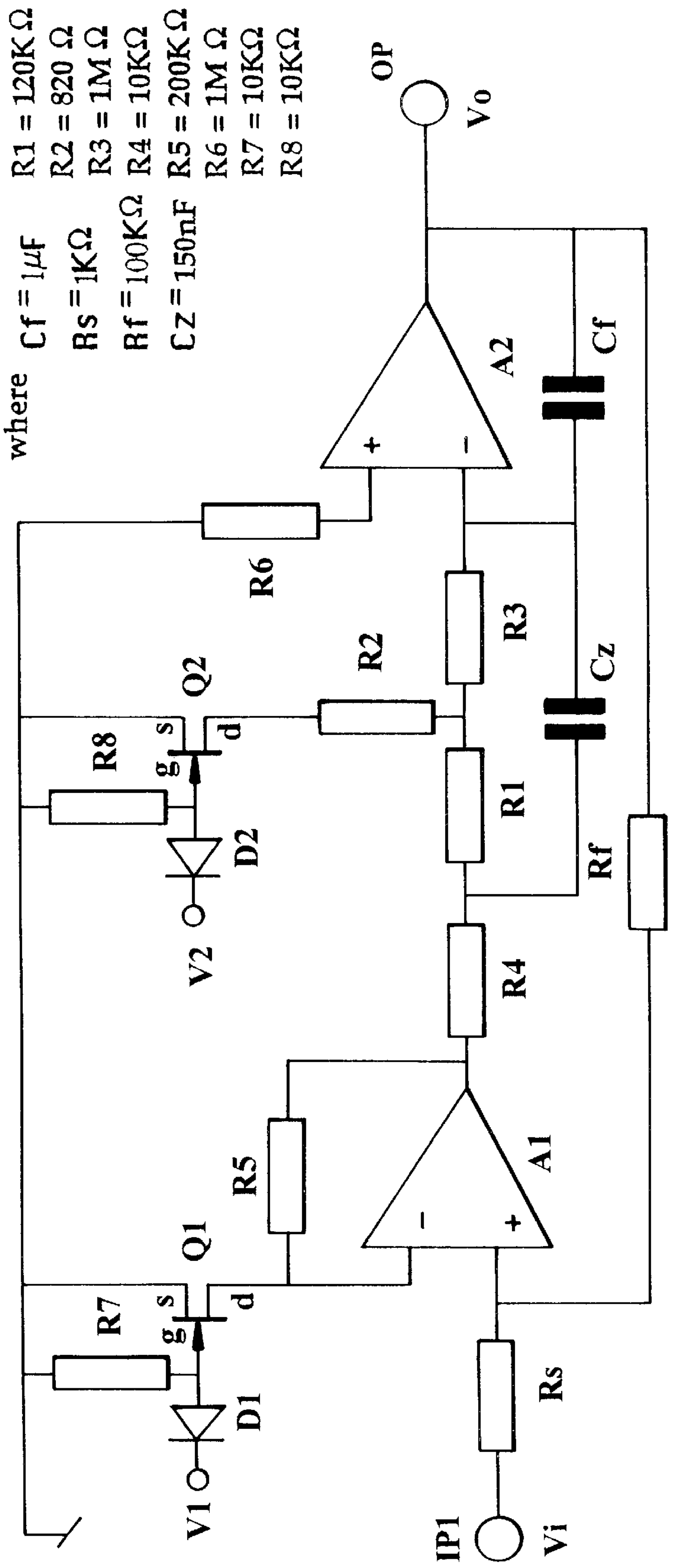
FIG. 6 is a modified version of the second integrator shown in FIG. 5.

The use of the loop filters shown in FIGS. 4 and 5 within a PLL would require an unreasonable amount of time to provide a locked output clock. This severe problem may be overcome by increasing the PLL jitter bandwidth to provide a rapid lock-in time. Once in lock, the PLL would revert to its intended low jitter bandwidth. One implementation of this technique is shown in FIG. 6. In this case, FET switches are provided, which operate to reduce the time constants t1 and t2 in a lock-in mode. A digital lock detection circuit is required (not shown) to detect the state of lock, and these can easily be implemented using one of several well known techniques.

The FET switches are formed by transistors Q1 and Q2, which are respectively connected to diodes D1 and D2 with resistors R7 and R8 connecting the link from the diodes to the gates of the transistors to ground. In fast lock mode, Q1 is switched on and Q2 is switched off, whereby the first op-amp is configured as a high gain stage K=R5/(Ron Q1), which is approximately 2000 (i.e. 66 dB). At this time Q2 would be off and thus the T network would have an effective resistance determined by the sum of R1, R3 and R4, equal to 1.13 MΩ.

The new time constants under fast lock conditions are determined by the following equations:

$$t_1=Cf((R4+R1+R3)(1+Rf/Rs)/K))$$

$$t_2=Cz(R4+R1+R3)$$

$$A=1$$

$$K=R5/RonQ1$$

It can be shown, for component values as follows:

Cf=1 μF

Rs=1 KΩ

Rf=100 KΩ

Cz=150 nF

R1=120 KΩ

R2=820 KΩ

R3=1 MΩ

R4=10 KΩ

R5=200 KΩ

R6=1 MΩ

R7=10 KΩ

R8=10 KΩ that the fast lock can be determined from the following equation:

$$\frac{Q1on}{Q2off}\ \frac{Vo}{Vi}=\frac{-100(1+s57\times10^{-3})}{(1+s168\times10^{-3})}$$

and that slow lock can be determined from the following equation:

$$\frac{Q1off}{Q2on}\ \frac{Vo}{Vi}=\frac{-100(1+s21.55)}{(1+s14.99\times10^{-3})}$$

It follows that the time constants are reduced: t1 from 15000 S to 57 mS and t2 from 22 S to 168 mS. Once the output clock from the PLL is locked to the incoming reference clock, an in-lock detector (not shown) would provide an appropriate control signal to the FET switches to revert to the PLL's ultra-low jitter bandwidth mode.

Although the modified Miller integrator shown in FIG. 5 has been employed to provide a very long time constant using discrete technology, the same circuit can be employed to provide long time constants for Integrated monolithic Circuits (ICs). Typical IC fabrication techniques can only provide monolithic capacitors of the order of tens of pico farads. Accordingly, if large integrating time constants are required, such as typically required in the case of monolithic PLLs, this can be only be achieved by using separate, large external capacitances. By the use of the techniques described above, however, a fully integrated PLL would be possible.

We claim:

1. An integrating circuit including a first and a second operational amplifier, each said operational amplifier having a non-inverting input, an inverting input and an output, the output of the first amplifier being coupled via an attenuating T network to the inverting input of the second amplifier, the first amplifier having a direct connection between its output and its inverting input, the second amplifier being configured as a Miller integrator, with the feedback acting on the inverting input of the second amplifier, the output of the second amplifier being connected to the non-inverting input of the first amplifier, wherein the integrating circuit receives an input signal through an input terminal connected to the non-inverting input of the first amplifier.

2. An integrating circuit according to claim 1 wherein, the attenuating T network comprises first and third resistors R1, R3 and the inverting input of the second amplifier is coupled via first and second resistors R1, R2 to ground.

3. An integrating circuit according to claim 1 wherein the non-inverting input of the second amplifier is connected to ground.

4. An integrating circuit according to claim 1 having a plurality of signal input terminals connected to the non-inverting input of the first amplifier via respective input resistances.

5. An integrating circuit according to claim 1 wherein the feedback of the Miller integrator arrangement comprises a resistance Rz.

6. An integrating circuit including first and second operational amplifiers, each said operational amplifier having a non-inverting input, an inverting input, and an output, the output of the first amplifier $A_1$ being coupled via an attenuating network to the inverting input of the second amplifier $A_2$ and via an attenuating network to ground, the first amplifier having a feedback connection between its output and its inverting input, the second amplifier being configured as a Miller integrator, with the feedback acting on the inverting input of the second amplifier, the output of the second amplifier being connected to the non-inverting input of the first amplifier, wherein the integrating circuit has two signal inputs being at the non-inverting input of the first amplifier, wherein a first signal input terminal is connected via a first input resistance to the non-inverting input of the first amplifier and a second input terminal is connected via a second input resistance to the non-inverting input of the first amplifier.

7. An integrating circuit according to claim 6 wherein the feedback of the Miller integrator arrangement comprises a resistance Rz.

8. An integrating circuit including first and second operational amplifiers, an output of the first amplifier $A_1$ being coupled via an attenuating network to an inverting input of the second amplifier $A_2$ and via an attenuating network to ground, the first amplifier having an inverting input which is connected to its output, the second amplifier being configured as a Miller integrator, with the feedback acting on the inverting input of the second amplifier, an output of the second amplifier being connected to the non-inverting input of the first amplifier, signal input(s) $IP_1$, $IP_2$ to the integrating circuit being at a non-inverting input of the first amplifier, wherein the attenuating network from the first amplifier $A_1$ to an inverting input of the second amplifier A2 comprises first and third resistors R1, R3 and a resistor R4 which lies intermediate the output of the first amplifier and the first and third resistors and the inverting input of the second amplifier is coupled via first and second resistors R1, R2 to ground; and wherein the feedback of the Miller integrator comprises a first capacitor Cf which is connected to both the inverting input of the second amplifier and a further capacitor Cz, the further capacitor being connected at its second terminal between the intermediate resistor R4 and the first resistor R1.

9. An integrating circuit according to claim 8 wherein a feedback loop for the inverting input of the first amplifier comprises a resistor R5, and wherein the feedback loop of the first amplifier and the grounding resistor R2 are connected to ground via respective switching circuits operable to reduce the integrating time constants.

10. An integrating circuit according to claim 8 wherein a feedback loop for the inverting input of the first amplifier comprises a resistor R5, and wherein the feedback loop of the first amplifier and the grounding resistor R2 are connected to ground via respective switching circuits operable to reduce the integrating time constants and wherein the switching circuits comprise FET switching circuits Q1 and Q2.

11. A method of operating an integrating circuit including first and second operational amplifiers, wherein an output of the first amplifier $A_1$ is coupled via an attenuating network to an inverting input of the second amplifier $A_2$ and via an attenuating network to ground, the first amplifier having an inverting input which has a feedback connection to its output, the second amplifier being configured as a Miller integrator, with the feedback acting on the inverting input of the second amplifier, an output of the second amplifier being connected to the non-inverting input of the first amplifier, signal input(s) $IP_1$, $IP_2$ to the integrating circuit being at the non-inverting input of the first amplifier, the method comprising the steps of inputting signals at the signal input(s) $IP_1$, $IP_2$ to the integrating circuit and feeding a signal to the first amplifier and its non-inverting input, feeding back a signal between the output of the first amplifier and its inverting input, coupling the output of the first amplifier $A_1$ via an attenuating network to an inverting input of the second amplifier $A_2$ and to ground, feeding back a signal from the output of the second amplifier and its inverting input, whereby a modulated output is produced dependent upon the relative phase of the input signals.

* * * * *